(12) United States Patent
Chen

(10) Patent No.: US 6,539,623 B1
(45) Date of Patent: Apr. 1, 2003

(54) MULTIMEDIACARD FABRICATION METHOD

(76) Inventor: Jerry Chen, No. 10, Alley 6, Lane 45, Pao Hsing Road, Hsin Tien, Taipei Hsien (TW)

( * ) Notice: Subject to any disclaimer, the term of this patent is extended or adjusted under 35 U.S.C. 154(b) by 0 days.

(21) Appl. No.: 09/552,587

(22) Filed: Apr. 19, 2000

(51) Int. Cl.$^7$ ................................. H05K 3/30
(52) U.S. Cl. ........................ 29/841; 29/846; 29/857; 29/858
(58) Field of Search .................... 29/846, 857, 858, 29/841, 831

(56) References Cited

U.S. PATENT DOCUMENTS

| | | | | |
|---|---|---|---|---|
| 4,138,924 A | * | 2/1979 | Seebach | 29/846 |
| 5,937,515 A | * | 8/1999 | Johnson | 29/830 |
| RE37,340 E | * | 8/2001 | King, Jr. | 174/87 |
| 6,351,884 B1 | * | 3/2002 | Damaschke et al. | 29/842 |

* cited by examiner

Primary Examiner—Timothy V. Eley
Assistant Examiner—Alvin J. Grant
(74) Attorney, Agent, or Firm—Donald C. Casey, Esq

(57) ABSTRACT

A MultiMediaCard fabrication method includes the steps of (1) PCB layout, (2) mounting a conductor plate on the circuit board thus obtained by means of surface mounting technique, (3) die bond, (4) wire bond, (5) glob top, (6) injection shell, and (7) printing the desired logo and design on the shell of the semi-finished product.

3 Claims, 3 Drawing Sheets

MULTIMEDIACARD FABRICATION METHOD

BACKGROUND OF THE INVENTION

The present invention relates a MultiMediaCard fabrication method, and more particularly to such a MultiMediaCard fabrication method, which greatly reduces MultiMediaCard manufacturing cost, and improves the product quality.

Following fast development of electronic integrated circuit technology and materials, chips are made having better function and smaller size for use in a variety of electronic goods including electronic dictionary, digital camera, etc. The application of electronic integrated circuits enables electronic products to be made smaller than ever. Nowadays various MultiMediaCards have been disclosed for use with multimedia apparatus that combines audio and video components to create an interactive application that uses text, sound, and graphics. FIG. 1 shows a MultiMediaCard fabrication method according to the prior art. This MultiMediaCard fabrication method comprises the steps of PCB layout, Die bond, Glob top, shell injection molding, adhesion, and printing. Because the shell is separately injection-molded from PVC (polyvinyl chloride) or ABS (acrylonitrile-butadiene-styrene) and then adhered to the encapsulated circuit board after the step of glob top, the fabrication procedure is complicated and time-consuming, in consequence the manufacturing cost is relatively high. Further, it is difficult to control the quality when adhering the shell to the encapsulated circuit board.

SUMMARY OF THE INVENTION

The present invention has been accomplished to provide a MultiMediaCard fabrication method, which eliminates the aforesaid drawbacks. It is one object of the present invention to provide a MultiMediaCard fabrication method, which greatly shortens the manufacturing time of MultiMediaCards. It is another object of the present invention to provide a MultiMediaCard fabrication method, which greatly reduces the manufacturing cost of MultiMediaCards. According to the present invention, the MultiMediaCard fabrication method comprises the steps of (1) PCB layout, (2) mounting a conductor plate on the circuit board thus obtained by means of surface mounting technique, (3) die bond, (4) wire bond, (5) glob top, (6) injection shell, and (7) printing the desired logo and design on the shell of the semi-finished product. Because these steps are continuously performed in series, the fabrication method achieves high efficiency, and the quality of finished goods is well controlled.

DETAILED DESCRIPTION OF THE PREFERRED EMBODIMENT

Figure 1:
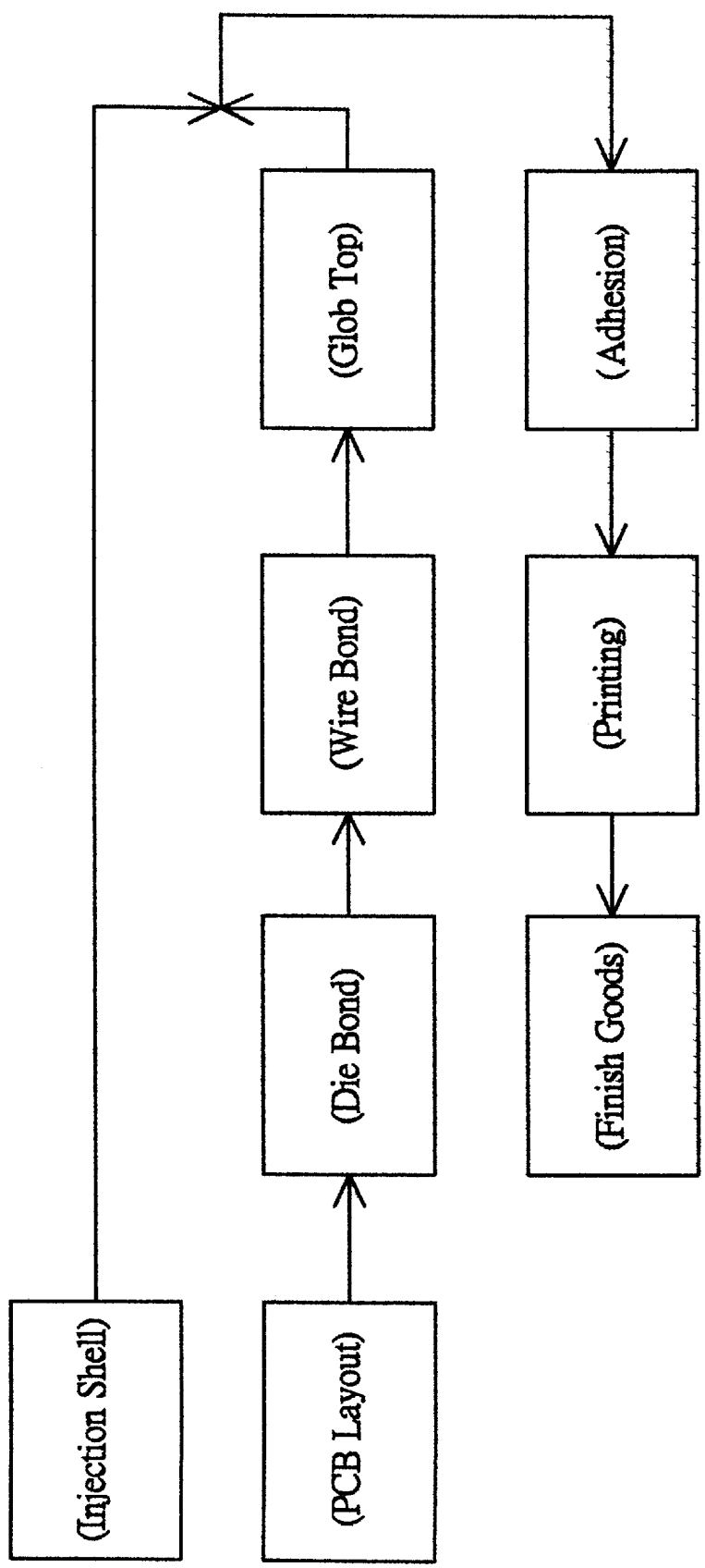
FIG. 1 is a flow chart explaining a multi-chip MultiMediaCard fabrication method according to the prior art.
Figure 2:
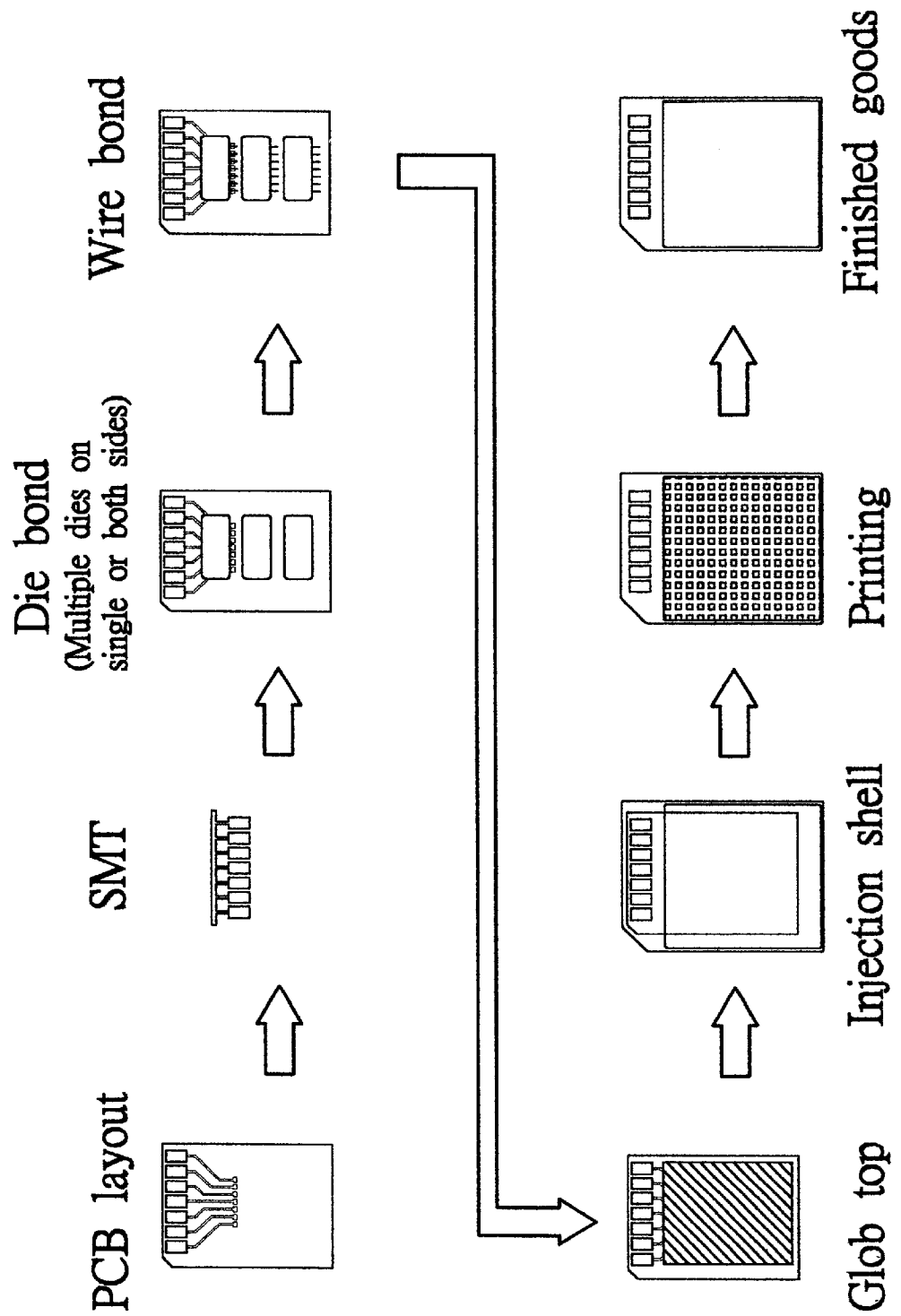
FIG. 2 is a flow chart explaining a multi-chip MultiMediaCard fabrication method according to the present invention.

Referring to FIG. 2, a multi-chip MMCard (MultiMediaCard) fabrication method in accordance with the present invention comprises the steps of:

1). PCB Layout: Designing an electronic circuit on a circuit board;

2). SMT: Mounting a conductor plate on the circuit board by means of surface mounting technique;

3). Die bond: Installing multiple dies in the circuit board on one or both sides of the circuit board subject to designed locations;

4). Wire bond: Fastening wire conductors (gold or aluminum wire conductors) to the dies;

5). Glob top: Encapsulating the dies on the circuit board with an encapsulating material;

6). Injection shell: Injection molding a shell on the encapsulated circuit board, forming a semi-finished product;

7). Printing: Printing the desired logo and design on the shell of the semi-finished product, and finished goods is thus obtained.

Figure 3:
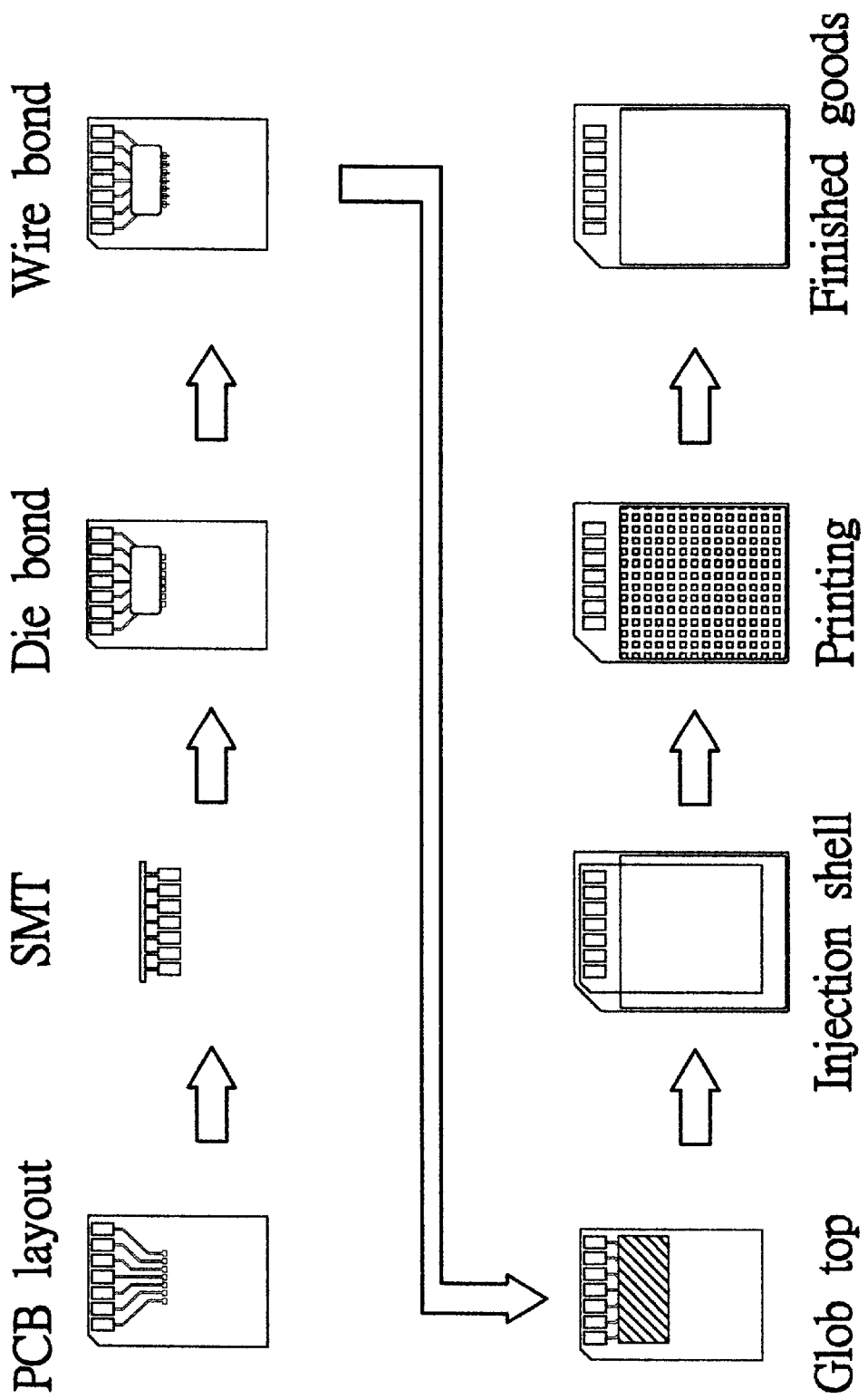
FIG. 3 is a flow chart explaining a mono-chip MultiMediaCard fabrication method according to the present invention.

FIG. 3 shows a mono-chip MultiMediaCard fabrication method according to the present invention. The procedure of this method is similar to the procedure shown in FIG. 2 with the exception of installing one single die in the circuit board during step 3). Die bond instead of installing multiple dies.

As indicated above, the present invention provides a MultiMediaCard fabrication method, which enables the designed MultiMediaCard to be efficiently manufactured at low cost.

What the invention claimed is:

1. A MultimediaCard fabrication method comprising the steps of:

a. designing an electronic circuit on a circuit board;

b. mounting a conductor plate on the circuit board thus obtained by means of surface mounting technique;

c. installing multiple at least one die in said circuit board;

d. fastening wire conductors (gold or aluminum wire conductors) to the dies;

e. encapsulating said at least one die on said circuit board with an encapsulating material;

f. injection molding a shell on the encapsulated circuit board thus obtained, forming a semi-finished product;

g. printing a logo and design on said semi-finished product, forming a finished product.

2. The MultiMediaCard fabrication method of claim 1 wherein said step c. of installing multiple at least one die in said circuit board is to install one die on one side of said circuit board.

3. The MultiMediaCard fabrication method of claim 1 wherein said step c. of installing multiple at least one die in said circuit board is to install a plurality of dies on two opposite sides of said circuit board.

* * * * *